United States Patent
Chow et al.

(10) Patent No.: US 9,281,268 B2
(45) Date of Patent: Mar. 8, 2016

(54) METHOD FOR FABRICATING MULTI-CHIP MODULE WITH MULTI-LEVEL INTERPOSER

(75) Inventors: Eugene M. Chow, Fremont, CA (US); John E. Cunningham, San Diego, CA (US); James G. Mitchell, Palo Alto, CA (US); Ivan Shubin, San Diego, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 939 days.

(21) Appl. No.: 13/517,591

(22) Filed: Jun. 13, 2012

(65) Prior Publication Data

US 2012/0266464 A1    Oct. 25, 2012

Related U.S. Application Data

(62) Division of application No. 12/719,975, filed on Mar. 9, 2010, now Pat. No. 8,218,334.

(51) Int. Cl.
*H05K 3/20* (2006.01)
*H01L 23/498* (2006.01)
(Continued)

(52) U.S. Cl.
CPC ...... *H01L 23/49811* (2013.01); *H01L 21/4853* (2013.01); *H01L 21/6835* (2013.01);
(Continued)

(58) Field of Classification Search
CPC ... H01L 21/4853; H01L 23/13; H01L 23/147; H01L 23/49811; H01L 23/544; H01L 24/13; H01L 24/81; H01L 25/0652; H01L 21/6835; Y10T 29/49947; Y10T 29/49204; Y10T 29/49165; Y10T 29/49895; Y10T 2221/68309; Y10T 2221/68345; Y10T 2223/54426; Y10T 2223/54473; Y10T 2224/13; Y10T 2224/13016; Y10T 2224/131; Y10T 2224/136; Y10T 2224/16237; Y10T 2224/81005; Y10T 2224/81007; Y10T 2224/81136; Y10T 2224/81138; Y10T 2224/81141; Y10T 2224/81191
USPC .................... 29/830–832, 842, 759; 174/255; 324/756.03, 762.01
See application file for complete search history.

(56) References Cited

U.S. PATENT DOCUMENTS 5,974,662 A * 11/1999 Eldridge et al. ................ 29/842
7,349,223 B2   3/2008 Haemer et al.
(Continued)

OTHER PUBLICATIONS

Krishnamoorthy, Ashok V., "Computer Systems Based on Silicon Photonic Interconnects", Proceedings of the IEEE, vol. 97, No. 7, Jul. 2009.
(Continued)

*Primary Examiner* — Donghai D Nguyen
(74) *Attorney, Agent, or Firm* — Park, Vaughan, Fleming & Dowler LLP; Anthony P. Jones

(57) ABSTRACT

A multi-level interposer plate and a multi-chip module (MCM) that includes the multi-level interposer plate are described. First surfaces and second surfaces in different regions of the multi-level interposer plate have associated, different thicknesses. Moreover, first micro-spring connectors and second micro-spring connectors are respectively disposed on the first surfaces and the second surfaces. In the MCM, a given one of the first surfaces of the multi-level interposer plate faces a bridge chip in a first layer in an array of chips in the MCM so that first connectors, disposed on the bridge chip, mechanically and electrically couple to the first micro-spring connectors. Similarly, a given one of the second surfaces of the multi-level interposer plate faces an island chip in a second layer in the array of chips so that second connectors, disposed on the island chip, mechanically and electrically couple to the second micro-spring connectors.

9 Claims, 12 Drawing Sheets

(51) Int. Cl.
*H01L 21/48* (2006.01)
*H01L 21/683* (2006.01)
*H01L 23/13* (2006.01)
*H01L 23/14* (2006.01)
*H01L 23/544* (2006.01)
*H01L 23/00* (2006.01)
*H01L 25/065* (2006.01)
*H01L 23/15* (2006.01)

(52) U.S. Cl.
CPC .............. *H01L23/13* (2013.01); *H01L 23/147* (2013.01); *H01L 23/544* (2013.01); *H01L 24/13* (2013.01); *H01L 24/81* (2013.01); *H01L 25/0652* (2013.01); *H01L 23/15* (2013.01); *H01L 23/49827* (2013.01); *H01L 24/16* (2013.01); *H01L 2221/68309* (2013.01); *H01L 2221/68345* (2013.01); *H01L 2223/54426* (2013.01); *H01L 2223/54473* (2013.01); *H01L 2224/13* (2013.01); *H01L 2224/131* (2013.01); *H01L 2224/136* (2013.01); *H01L 2224/13016* (2013.01); *H01L 2224/16237* (2013.01); *H01L 2224/81005* (2013.01); *H01L 2224/81007* (2013.01); *H01L 2224/81136* (2013.01); *H01L 2224/81138* (2013.01); *H01L 2224/81141* (2013.01); *H01L 2224/81191* (2013.01); *H01L 2224/81192* (2013.01); *H01L 2224/81801* (2013.01); *H01L 2224/81901* (2013.01); *H01L 2924/0001* (2013.01); *H01L 2924/014* (2013.01); *H01L 2924/01006* (2013.01); *H01L 2924/01033* (2013.01); *H01L 2924/01075* (2013.01); *H01L 2924/01327* (2013.01); *H01L 2924/12042* (2013.01); *H01L 2924/15156* (2013.01); *H01L 2924/15787* (2013.01); *Y10T 29/49165* (2015.01); *Y10T 29/49204* (2015.01); *Y10T 29/49895* (2015.01); *Y10T 29/49947* (2015.01)

(56) References Cited

U.S. PATENT DOCUMENTS

| | | | |
|---|---|---|---|
| 7,579,848 B2 * | 8/2009 | Bottoms et al. | 324/756.03 |
| 7,649,145 B2 | 1/2010 | Kirby et al. | |
| 8,089,777 B2 | 1/2012 | Negishi | |
| 2005/0051353 A1 | 3/2005 | Chong et al. | |
| 2008/0143379 A1 | 6/2008 | Norman | |
| 2012/0034774 A1 | 2/2012 | Anthony et al. | |

OTHER PUBLICATIONS

Shubin, I, "A Novel MCM Package Enabling Proximity Communication I-O", 2011 Electronic Components and Technology Conference.

Sze, T. "Proximity Communication Flip-Chip Package with Micron Chip-to-chip Alignment Tolerances", 2009 Electronic Components and Technology Conference.

* cited by examiner

─ 900

```
┌─────────────────────────────────────────────────────────────┐
│ DEFINE FIRST MICRO-SPRING CONNECTORS ON FIRST SURFACES OF   │
│ FIRST SUBSTRATES, WHERE THE FIRST SUBSTRATES HAVE A FIRST   │
│ THICKNESS                                                    │
│ 910                                                          │
└─────────────────────────────────────────────────────────────┘
                              │
                              ▼
┌─────────────────────────────────────────────────────────────┐
│ DEFINE SECOND MICRO-SPRING CONNECTORS ON SECOND SURFACES OF │
│ SECOND SUBSTRATES, WHERE THE SECOND SUBSTRATES HAVE A SECOND│
│ THICKNESS                                                    │
│ 912                                                          │
└─────────────────────────────────────────────────────────────┘
                              │
                              ▼
┌─────────────────────────────────────────────────────────────┐
│ ATTACH THE FIRST SUBSTRATES AND THE SECOND SUBSTRATES TO A  │
│ MECHANICAL ALIGNMENT PLATE                                   │
│ 914                                                          │
└─────────────────────────────────────────────────────────────┘
                              │
                              ▼
┌─────────────────────────────────────────────────────────────┐
│ MECHANICALLY COUPLE THE FIRST SUBSTRATES TO THE SECOND      │
│ SUBSTRATES, THEREBY FABRICATING A MULTI-LEVEL INTERPOSER PLATE│
│ 916                                                          │
└─────────────────────────────────────────────────────────────┘
                              │
                              ▼
┌─────────────────────────────────────────────────────────────┐
│ DETACH THE MECHANICAL ALIGNMENT PLATE                        │
│ (OPTIONAL)                                                   │
│ 918                                                          │
└─────────────────────────────────────────────────────────────┘
```

FIG. 9

METHOD FOR FABRICATING MULTI-CHIP MODULE WITH MULTI-LEVEL INTERPOSER

RELATED APPLICATIONS

This application is a divisional application of, and hereby claims priority under 35 U.S.C. §120 to, pending U.S. patent application Ser. No. 12/719,975, now U.S. Pat. No. 8,218,334, which is entitled "Multi-Chip Module with Multi-Level Interposer," by inventors Eugene M. Chow, John E. Cunningham, James G. Mitchell, and Ivan Shubin, which was filed on 9 Mar. 2010, and which is hereby incorporated by reference.

BACKGROUND

1. Field

The present disclosure generally relates to multi-chip modules (MCMs) and techniques for fabricating MCMs. More specifically, the present disclosure relates to an MCM that includes a multi-level interposer plate between a base plate and an array of chips in the MCM.

2. Related Art

Multi-chip modules (MCMs) that facilitate proximity communication between multiple integrated circuits (ICs) or chips (such as capacitively coupled proximity communication) are being developed for next generation high-performance computers. In these MCMs, chips are often positioned face-to-face so that information can be communicated between proximity connectors (such as metal pads) on the surfaces of the facing chips.

In order to enable ultrafast chip-to-chip communication speeds via capacitive coupling between the metal pads on the facing chips, these chips need to be aligned with each other. In addition, to address the so-called 'known-good-die' problem, and thus to facilitate scaling to large numbers of chips, the chips are ideally fully tested after assembly because it is expensive to replace the ceramic substrate in an MCM in the event of a bad or faulty chip. Consequently, there is increasing need to provide remateable interconnects between the chips and the ceramic substrate in such MCMs.

Wire bonding and solder-ball flip-chip bonding are widely used in electronic packages to produce chip-to-substrate interconnects. However, these packaging technologies usually do not facilitate remateable interconnects in a large array of chips.

Stressed-metal spring or claw interconnects (which are henceforth referred to as 'micro-spring connectors') are promising candidates for use in remateable chip-to-package interconnects. In particular, micro-spring connectors offer low-resistance electrical contacts even after multiple engage-disengage cycles. However, it can be difficult to fabricate an MCM having a large, multi-level array of chips that are coupled using micro-spring connectors while maintaining the precise geometric alignment that is needed for proximity communication. As a consequence, the costs of such MCMs can be prohibitive.

Hence, what is needed is an MCM and an associated fabrication technique which do not suffer from the above-described problems.

SUMMARY

One embodiment of the present disclosure provides a multi-chip module (MCM) that includes: a base plate, and a multi-level interposer plate having one or more first surfaces and one or more second surfaces located in different regions of the multi-level interposer plate that have associated, different thicknesses. Moreover, one or more first micro-spring connectors and one or more second micro-spring connectors are respectively disposed on the first surfaces and the second surfaces. Furthermore, the MCM includes an array of chips, including: bridge chips in a first layer in the array, which have first connectors disposed on their surfaces; and island chips in a second layer in the array, which have second connectors disposed on their surfaces. Additionally, a given one of the bridge-chip surfaces faces a given first surface of the multi-level interposer plate, such that the first connectors mechanically and electrically couple to the first micro-spring connectors. Similarly, a given one of the island-chip surfaces faces a given second surface of the multi-level interposer plate such that the second connectors mechanically and electrically couple to the second micro-spring connectors.

Note that the multi-level interposer plate includes a monolithic substrate having a first thickness in some of the regions and a second thickness in other regions. In some embodiments, the first thickness is less than the second thickness, and the monolithic substrate may include through-substrate vias (TSVs) in the regions having the second thickness. These TSVs may couple the second micro-spring connectors to connectors on a back surface of the multi-level interposer plate, which, in turn, are electrically coupled to corresponding connectors on the base plate.

However, in other embodiments the multi-level interposer plate includes multiple substrates, including first substrates having the first thickness and second substrates having the second thickness. Furthermore, the first thickness may be less than the second thickness, and the second substrates may include TSVs, which couple the second micro-spring connectors to connectors on back surfaces of the second substrates.

Additionally, overlapping facing surfaces of a given island chip and a given bridge chip may include proximity connectors that are configured to communicate signals via proximity communication. For example, the proximity communication may include: optical proximity communication, capacitive proximity communication, inductive proximity communication and/or conductive proximity communication.

In some embodiments, the overlapping, facing surfaces include negative alignment features, and the MCM includes positive alignment features that mate with a given pair of the negative alignment features, thereby mechanically aligning the island chips and the bridge chips. For example, the negative alignment features may include pits, and the positive alignment features may include microspheres.

In embodiments where the first thickness is less than the second thickness, the bridge chips may be positioned in negative recesses in the multi-level interposer plate. In contrast, in embodiments where the first thickness is greater than the second thickness, the island chips may be positioned in negative recesses in the multi-level interposer plate.

Furthermore, the multi-level interposer plate may include side-wall interconnects disposed on side walls of the multi-level interposer plate between the first surfaces and the second surfaces. These side-wall interconnects may electrically couple the first micro-spring connectors and the second micro-spring connectors.

Additionally, the second surfaces may include first negative alignment features, and the surface of each island chip may include second negative alignment features. In these embodiments, the MCM may include positive alignment features that mate with a given pair of the first negative alignment features and the second negative alignment features, thereby mechanically aligning the island chips with respect to the multi-level interposer plate. For example, the first negative alignment features and the second negative alignment features may include pits, and the positive alignment features may include microspheres.

Note that a sum of a thickness of the bridge chips and the first thickness may approximately equal the second thickness.

Another embodiment provides a system that includes the MCM.

Another embodiment provides the multi-level interposer plate for use in the MCM.

Another embodiment provides an electronic device that includes the MCM.

Another embodiment provides a method for fabricating the multi-level interposer plate for use in the MCM. During the method, the first micro-spring connectors are defined on first surfaces of first substrates, where the first substrates have the first thickness. Then, second micro-spring connectors are defined on second surfaces of second substrates, where the second substrates have the second thickness. Note that the second thickness may be greater than the first thickness. Next, the first substrates and the second substrates are attached to a mechanical alignment plate. Also, the first substrates are mechanically coupled to the second substrates, thereby fabricating the multi-level interposer plate. Subsequently, the mechanical alignment plate may be detached.

BRIEF DESCRIPTION OF THE FIGURES

FIG. 9 is a flow chart illustrating a process for fabricating a multi-level interposer plate for use in an MCM in accordance with an embodiment of the present disclosure.

Note that like reference numerals refer to corresponding parts throughout the drawings. Moreover, multiple instances of the same type of part are designated by a common prefix separated from an instance number by a dash.

DETAILED DESCRIPTION

Embodiments of a multi-level interposer plate, a multi-chip module (MCM) that includes the multi-level interposer plate, and a technique for fabricating the multi-level interposer plate are described. First surfaces and second surfaces in different regions of the multi-level interposer plate have associated, different thicknesses. Moreover, first micro-spring connectors and second micro-spring connectors are respectively disposed on the first surfaces and the second surfaces. In the MCM, a given one of the first surfaces of the multi-level interposer plate faces a bridge chip in a first layer in an array of chips in the MCM so that first connectors, disposed on the bridge chip, mechanically and electrically couple to the first micro-spring connectors. Similarly, a given one of the second surfaces of the multi-level interposer plate faces an island chip in a second layer in the array of chips in the MCM so that second connectors, disposed on the island chip, mechanically and electrically couple to the second micro-spring connectors. Note that the bridge chip and the island chip may communicate information with each other via proximity communication.

This multi-level interposer plate may facilitate a low-cost MCM having a large array of chips arranged in multiple layers. In particular, by using the multi-level interposer plate, the problem of fabricating an MCM having a large, multi-level array of chips that are coupled using micro-spring interconnects while maintaining the precise geometric alignment that is typically needed for proximity communication can be solved. Furthermore, because the micro-spring interconnects may be remateable, the multi-level interposer may enable efficient packaging of multiple layers of face-to-face chips with testable, re-workable micro-spring interconnector technology.

Figure 1A:
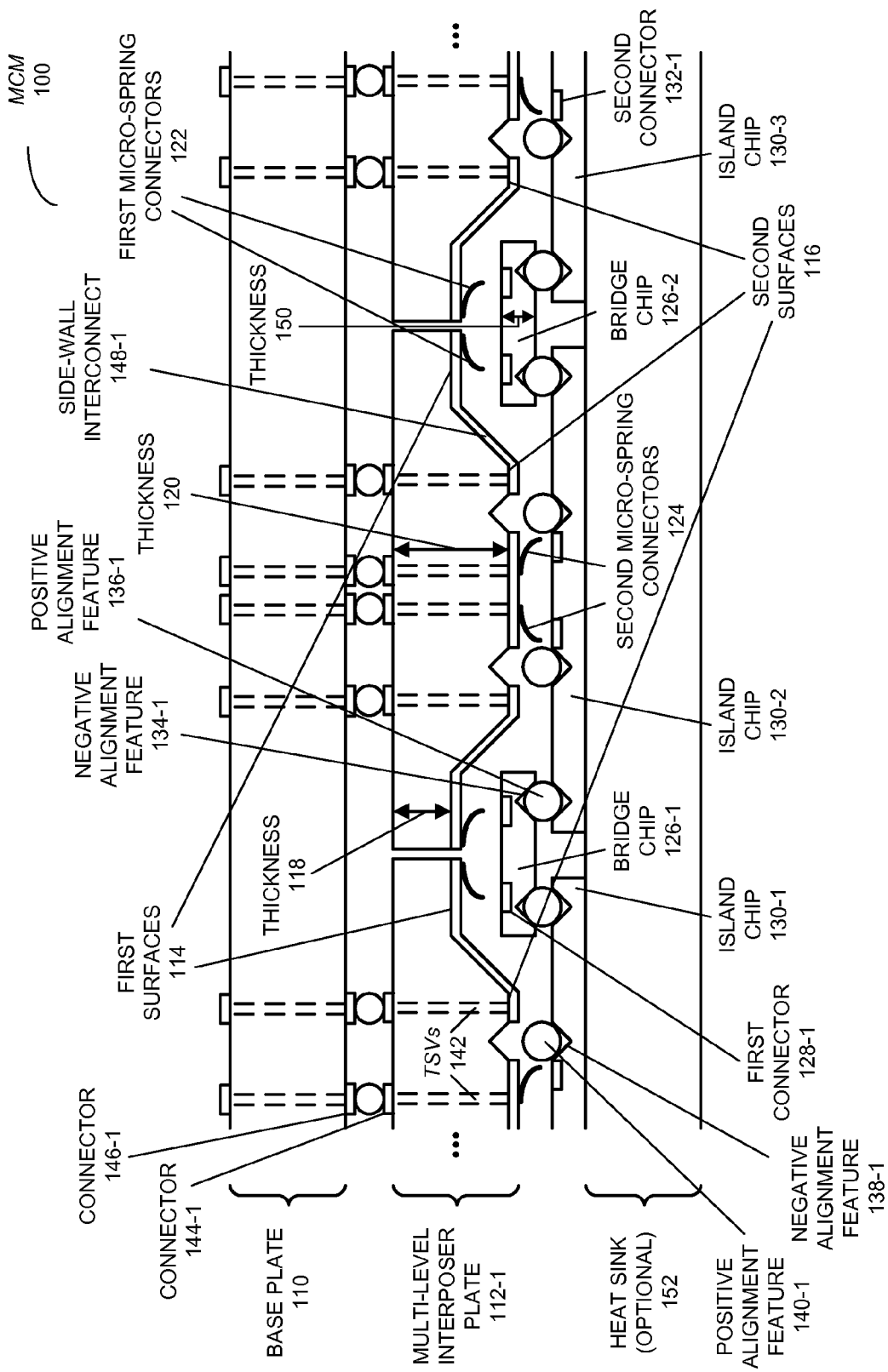
FIG. 1A is a block diagram illustrating a multi-chip module (MCM) in accordance with an embodiment of the present disclosure.

We now describe embodiments of the multi-level interposer and the MCM. FIG. 1A presents a block diagram illustrating an MCM 100. This MCM includes: a base plate 110, and a multi-level interposer plate 112-1 having one or more first surfaces 114 and one or more second surfaces 116 in different regions of multi-level interposer plate 112-1 that have associated, different thicknesses 118 and 120. Note that thickness 118 is less than thickness 120, thereby defining recessed regions (such as etch pits) in multi-level interposer plate 112-1. In addition, note that in FIG. 1A bridge chips 126, island chips 130 and optional heat sink 152 are offset vertically from multi-level interposer plate 112-1 for clarity.

Moreover, one or more first micro-spring connectors 122 and one or more second micro-spring connectors 124 are respectively disposed on first surfaces 114 and second surfaces 116. As described further below with reference to FIGS. 8A and 8B, these micro-spring connectors may include stress-engineered or self-bending springs, e.g., a type of spring that bends up on its own during fabrication. For example, the micro-spring connectors may include an anchor portion located in a base section, and a curved free portion that extends from anchor portion and is located in curved cantilever section that includes a stress gradient. This stress gradient may be associated with: a sputtering process, a plating process, a material in the micro-spring connectors (such as an intermetalic compound), and/or two or more materials in the micro-spring connectors (such as a bimorph or a bimetallic composition). Note that a self-bending spring may include a metal film (or a non-metal film) having a non-zero internal mechanical stress gradient when formed or subsequently annealed that causes the metal film to bend (curl) away from the substrate after release. Moreover, the term "stress-engineered metal" or "stressy metal" includes a sputtered or plated metal film with either a non-zero internal stress gradient, or an intermetallic metal film formed in accordance with co-owned and co-pending U.S. patent application Ser.

No. 10/912,418, entitled "Intermetallic Spring Structure", which is incorporated herein by reference.

Furthermore, MCM 100 includes an array of chips, including: bridge chips 126 in a first layer in the array, which have first connectors (such as first connector 128-1) disposed on their surfaces; and island chips 130 in a second layer in the array, which have second connectors (such as second connector 132-1) disposed on their surfaces. Additionally, a given one of the bridge-chip surfaces faces a given first surface of multi-level interposer plate 112-1 such that first connectors mechanically and electrically couple to first micro-spring connectors 122. Similarly, a given one of the island-chip surfaces faces a given second surface of multi-level interposer plate 112-1 such that second connectors mechanically and electrically couple to second micro-spring connectors 124.

In general, in the present discussion an MCM may include an array of chip modules (CMs) or single-chip modules (SCMs), and a given SCM may include at least one substrate, such as a semiconductor die. Note that an MCM is sometimes referred to as a 'macro-chip.' Furthermore, the substrate may communicate with other substrates, CMs and/or SCMs in the MCM using proximity communication of electromagnetically coupled signals (which is referred to as 'electromagnetic proximity communication'). For example, overlapping facing surfaces of a given island chip (such as island chip 130-1) and a given bridge chip (such as bridge chip 126-1) may include proximity connectors (not shown) that are configured to communicate signals via proximity communication. Proximity communication may include: communication of capacitively coupled signals ('electrical proximity communication' or 'capacitive proximity communication') and/or communication of optical signals (such as 'optical proximity communication'). In some embodiments, the electromagnetic proximity communication includes inductively coupled signals ('inductive proximity communication') and/or conductively coupled signals ('conductive proximity communication').

To facilitate assembly and the precise alignment typically needed for proximity communication, the overlapping, facing surfaces may include negative alignment features (such as negative alignment feature 134-1), and MCM 100 may include positive alignment features (such as positive alignment feature 136-1) that mate and/or self-lock with a given pair of the negative alignment features, thereby mechanically coupling and aligning island chips 130 and bridge chips 126. For example, the negative alignment features may include pits, grooves, undercut ledges, etc., and the positive alignment features may include microspheres, protrusions (such as half-hemispheres, hooks, top-hat shapes, etc.), pairs of counterposed micro-springs on the facing surfaces, etc. More generally, a given negative feature may be recessed below a surrounding surface, and may have an opening defined by an edge. Moreover, a given positive alignment feature may protrude above a surrounding surface.

Furthermore, second surfaces 116 may include additional negative alignment features (such as negative alignment feature 138-1), and the surface of each island chip may include the additional negative alignment features. In these embodiments, MCM 100 may include additional positive alignment features (such as positive alignment feature 140-1) that mate and/or self-lock with a given pair of the additional negative alignment features, thereby mechanically aligning island chips 130 with respect to multi-level interposer plate 112-1. For example, the additional negative alignment features may include pits, grooves, undercut ledges, etc., and the additional positive alignment features may include microspheres, protrusions (such as half-hemispheres, hooks, top-hat shapes, etc.), pairs of counterposed micro-springs on the facing surfaces, etc.

These positive and negative alignment features may be compatible with high-volume manufacturing. In particular, the positive and negative features may be fabricated on the surfaces using semiconductor-process techniques. Therefore, MCM 100 may be fabricated and assembled without using an external locking mechanism or an adhesive (such as glue), which may reduce the cost of MCM 100.

In some embodiments, regions of multi-level interposer plate 112-1 having thickness 120 (which is greater than thickness 118) include through-substrate vias (TSVs) TSV 142. These TSVs may couple second micro-spring connectors 124 to connectors, such as connector 144-1 (which may be a bonding pad), on a back surface of multi-level interposer plate 112-1. In turn, the connectors on the back surface are electrically coupled to corresponding connectors, such as connector 146-1, on base plate 110.

Note that fabricating TSVs in regions of multi-level interposer plate 112-1 having thickness 118 may be difficult because first surfaces 114 may need to be smooth for subsequent micro-spring-connector fabrication, and polishing is often not possible in recessed regions, such as etch pits. Consequently, fabricating the TSVs after the etch pit is defined may be more expensive. In some embodiments, this problem is addressed by integrating side-wall interconnects, such as side-wall interconnect 148-1, disposed on side walls of multi-level interposer plate 112-1 between first surfaces 114 and second surfaces 116 (i.e., along the walls of the recessed regions). These side-wall interconnects may electrically couple first micro-spring connectors 122 and second micro-spring connectors 124, which may allow TSVs 142 to be positioned in regions of multi-level interposer plate 112-1 having thickness 120 instead of in regions having thickness 118. As described further below with reference to FIGS. 8A and 8B, this may make it easier to fabricate micro-spring connectors inside of the recessed regions.

In an exemplary embodiment, multi-level interposer plate 112-1 is fabricated on a semiconductor substrate (such as silicon). However, other materials may be used, such as: a ceramic material, an organic material, glass, a printed circuit board and/or a plastic material. Similarly, base plate 110 may be: a semiconductor substrate (such as silicon), a ceramic material, an organic material, glass, a printed circuit board and/or a plastic material. Moreover, a sum of a thickness 150 of bridge chips 126 and thickness 118 may approximately equal thickness 120.

Note that in some embodiments MCM 100 includes optional heat sink 152.

As shown in FIG. 1A, regions of multi-level interposer plate 112-1 having thickness 118 (such as etch pits) may be located in the edges of sub-components in multi-level interposer plate 112-1. Alternatively, as shown in FIG. 1B, which presents a block diagram illustrating an MCM 160, regions of multi-level interposer plate 112-2 having thickness 118 may be located at the center of sub-components in multi-level interposer plate 112-2.

Figure 1B:
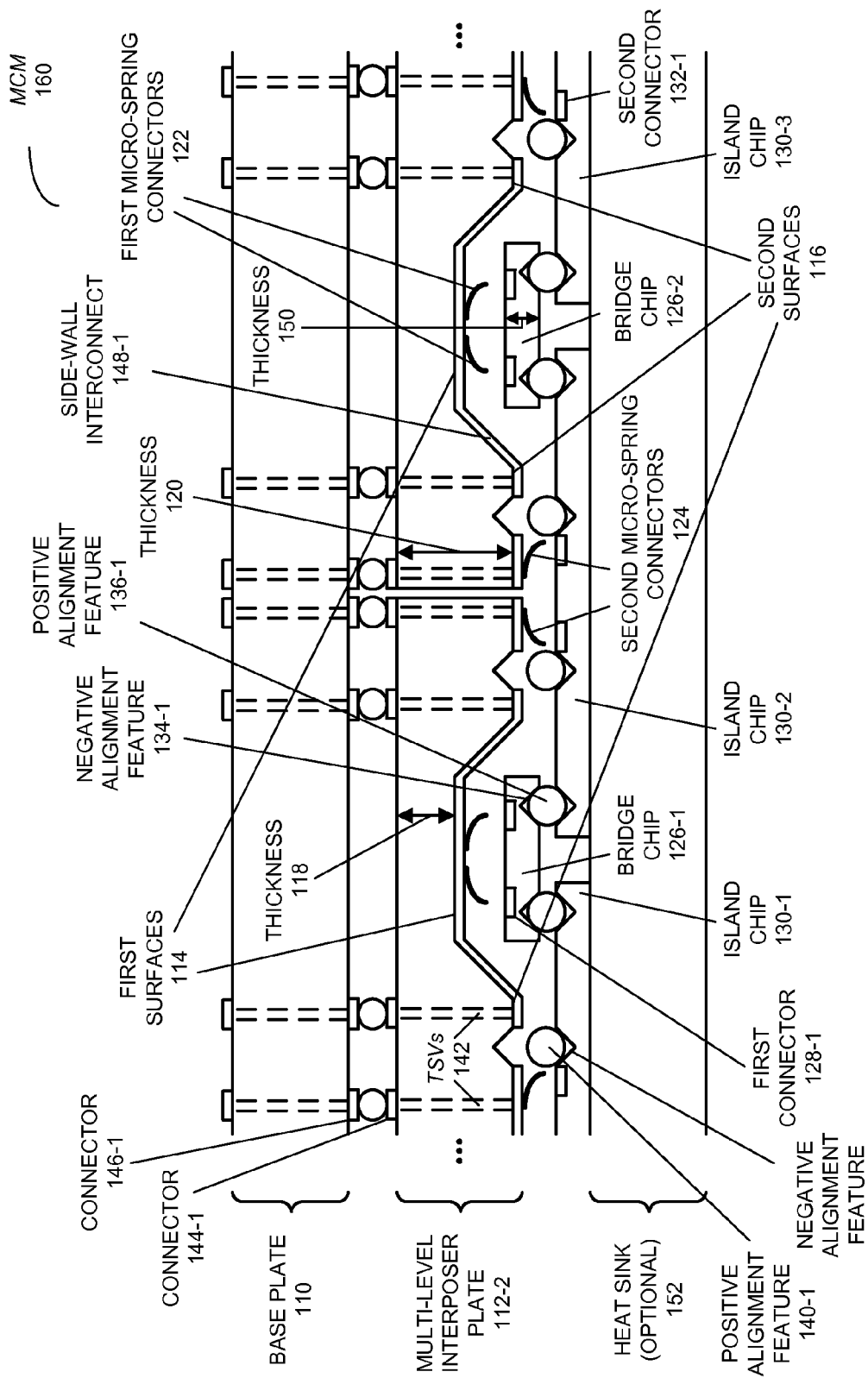
FIG. 1B is a block diagram illustrating an MCM in accordance with an embodiment of the present disclosure.
Figure 2:
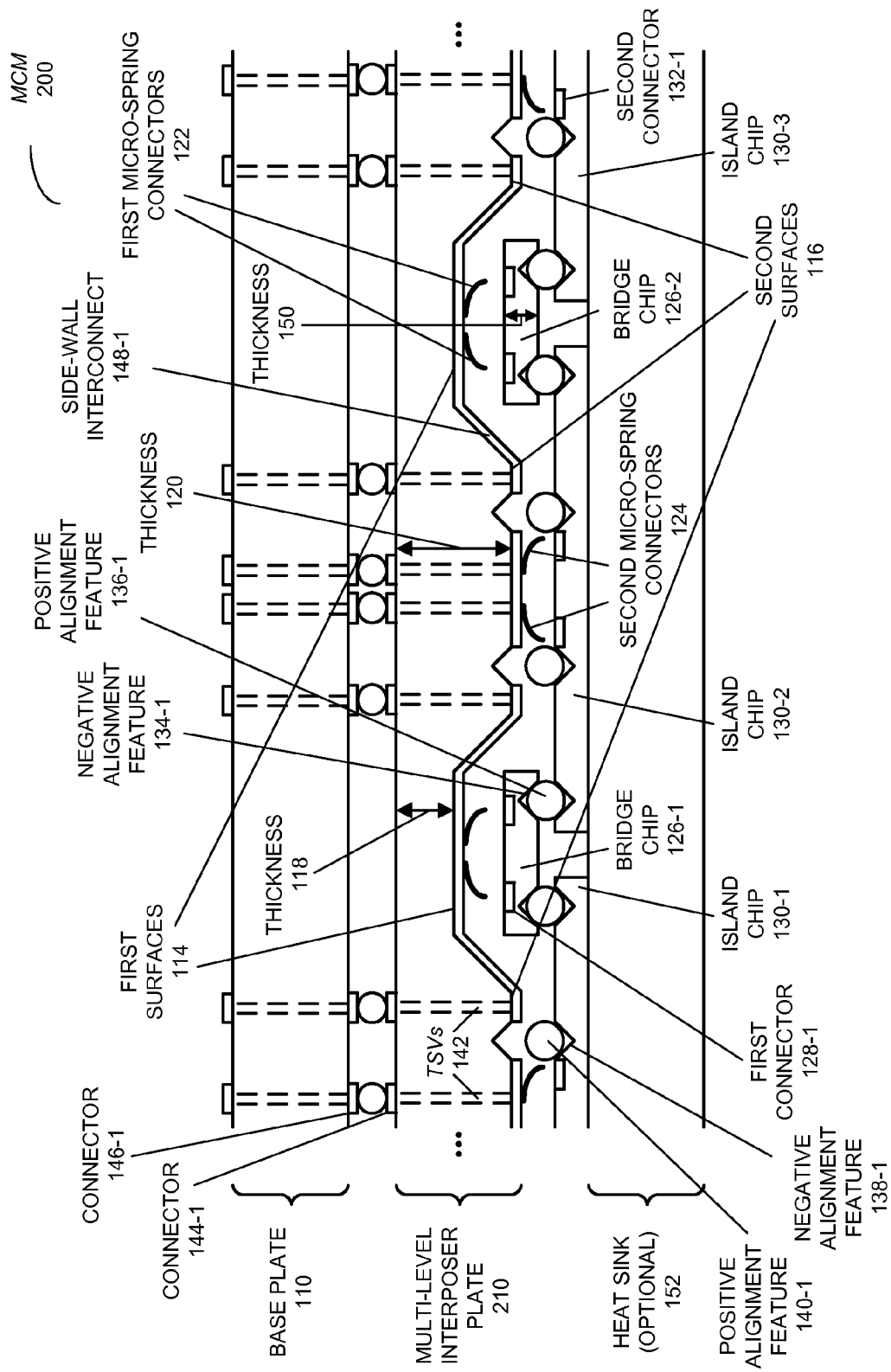
FIG. 2 is a block diagram illustrating an MCM in accordance with an embodiment of the present disclosure.
Figure 4:
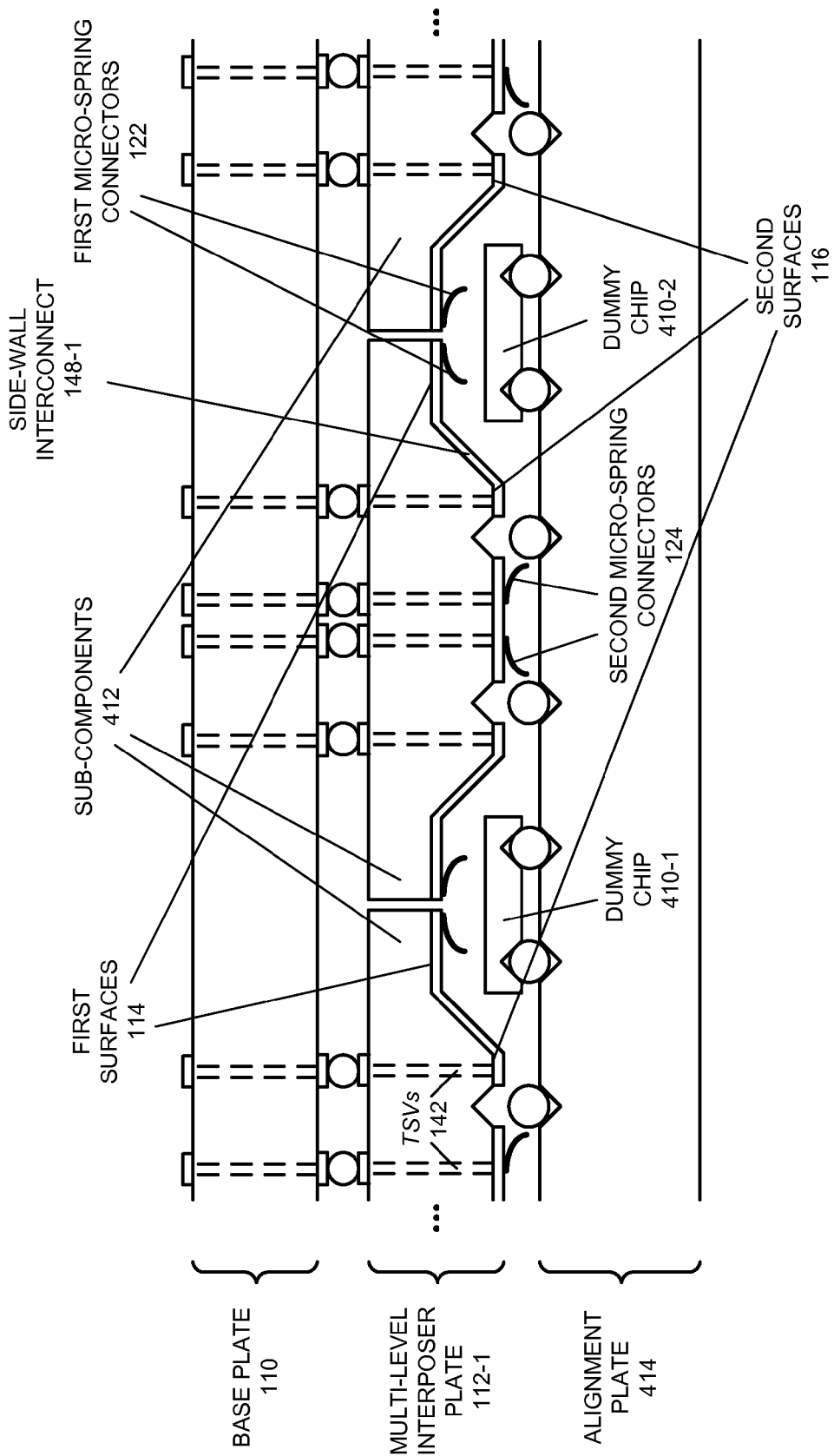
FIG. 4 is a block diagram illustrating assembly of a hybrid multi-level interposer plate in accordance with an embodiment of the present disclosure.

Furthermore, FIGS. 1A and 1B illustrate embodiments of hybrid multi-level interposer plates 112, which are assembled from multiple sub-components (for example, using the fabrication technique discussed below with reference to FIG. 4). A hybrid multi-level interposer plate may allow the micro-spring connectors to be fabricated on smaller substrates and in smaller units, which may improve micro-spring-connector fabrication yield because the micro-spring die may be the size of bridge chips 126 and/or island chips 130, and not the size of MCM 100. However, in other embodiments a monolithic substrate is used. This is shown in FIG. 2, which present a block diagram of MCM 200 that includes a multi-level interposer plate 210.

Figure 3:
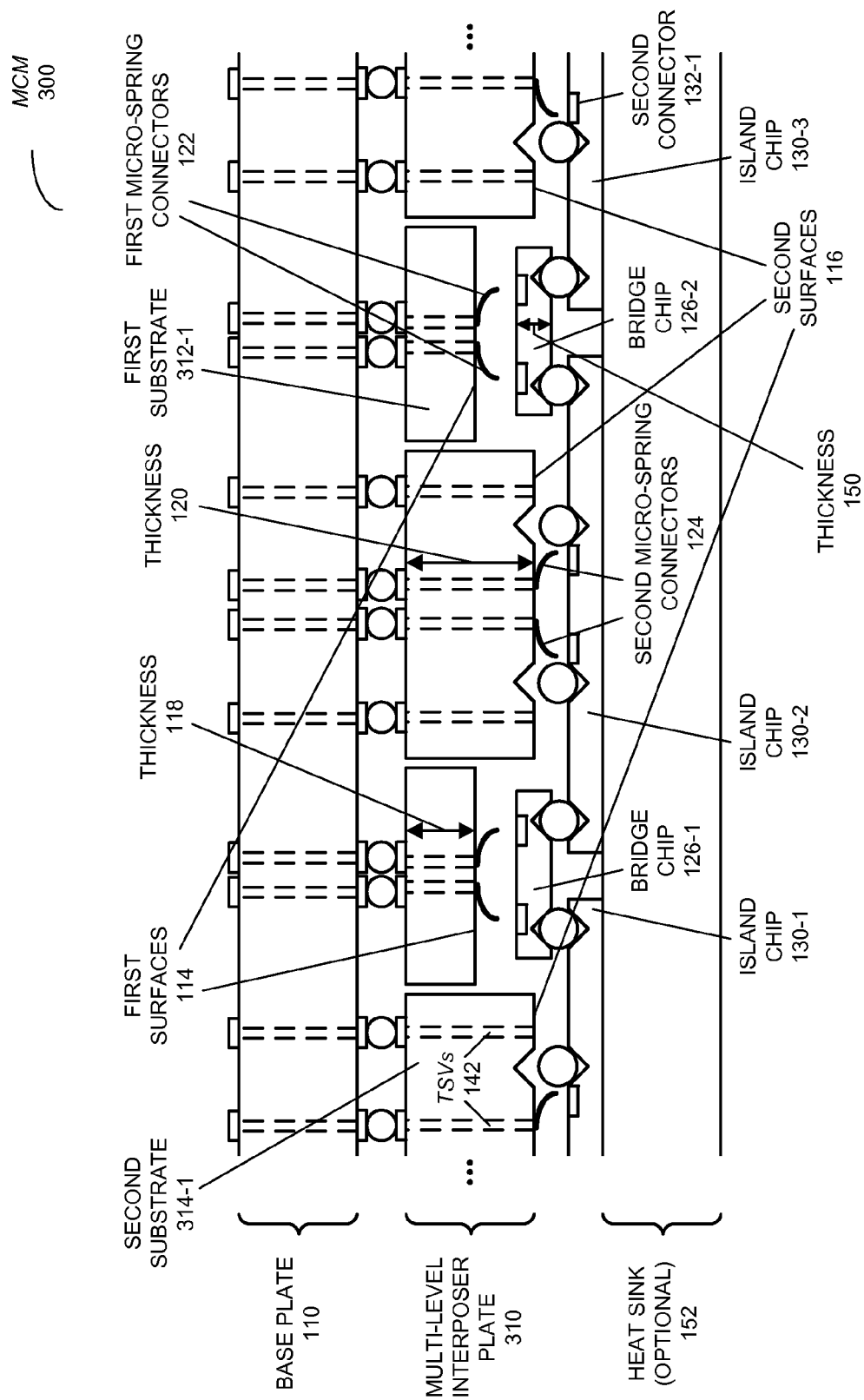
FIG. 3 is a block diagram illustrating an MCM in accordance with an embodiment of the present disclosure.

Micro-spring-connector fabrication in the base of the recessed regions may be a low-yield operation because of lithography complexities (as described further below with reference to FIGS. 8A and 8B). Consequently, in some embodiments the multi-level interposer plate does not have micro-spring-connectors inside of an etch pit. Instead, multiple substrates having different thicknesses are combined to fabricate a multi-level interposer plate. This is shown in FIG. 3, which presents a block diagram of MCM 300. In this MCM, a hybrid multi-level interposer plate 310 includes multiple substrates, including first substrates, such as substrate 312-1, having thickness 118 and second substrates, such as substrate 314-1, having thickness 120. Note that thickness 118 may be less than thickness 120, and the first and second substrates may include TSVs 142, which, respectively, couple first micro-spring connectors 122 and second micro-spring connectors 124 to connectors on back surfaces of the first and second substrates.

In an exemplary embodiment, thickness 118 is approximately 200 μm, thickness 120 is approximately 400 μm, and thickness 150 is approximately 200 μm. Note that fabrication of multi-level interposer plate 310 may be simpler if the first and second substrates have predefined TSVs 142. Then, first and second micro-spring connectors 122 and 124 may be fabricated on one side of these substrates, and the connectors to base plate 110 may be fabricated on the other side. Furthermore, positive and/or negative alignment features may be defined, for example, prior to the micro-spring-connector fabrication.

In some embodiments, sub-components in a hybrid multi-level interposer plate may be assembled using flip-chip fabrication techniques on an alignment plate. Then, the sub-components may be rigidly mechanically coupled to the alignment plate, for example, using solder. In order to maintain precise alignment during assembly of a hybrid multi-level interposer plate, dummy chips with positive or negative alignment features (such as pits) may be used. This is shown in FIG. 4, which presents a block diagram illustrating assembly of hybrid multi-level interposer plate 112-1. Note that dummy chips 410 may mimic the dimensions of bridge chips 126 (FIGS. 1A-3). Furthermore, sub-components 412 (such as silicon sub-interposer plates) may be placed into their corresponding locations in multi-level interposer plate 112-1, and they may be aligned using positive alignment features (such as balls or micro-spheres). This configuration may be used to maintain the alignment of sub-components 412 with respect to each other during the bonding to alignment plate 414 (such as a ceramic plate).

Note that this alignment technique may not be needed for multi-level interposer plate 310 (FIG. 3) because first substrates, such as first substrate 312-1 (FIG. 3), may not have to be precise. For example, these substrates may electrically couple to lower power pads on the backside of bridge chips 126 (FIGS. 1A-3), and first micro-spring connectors 122 may be used to correct misalignment if there is enough force to hold bridge chips 126 (FIGS. 1A-3) in place so that the proximity-communication region is stable.

Figure 5:
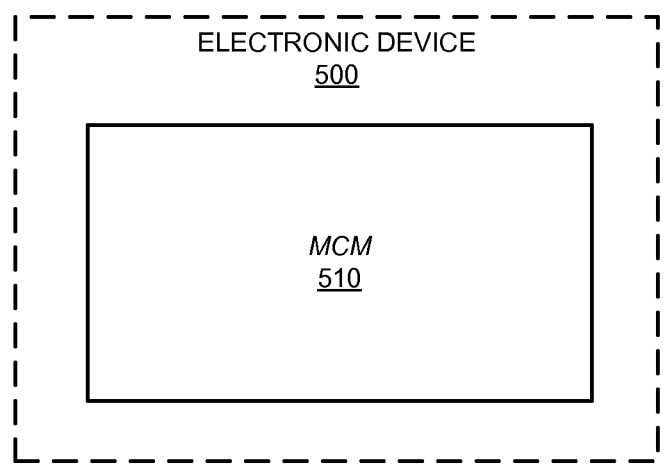
FIG. 5 is a block diagram of an electronic device that includes an MCM in accordance with an embodiment of the present disclosure.

One or more of the preceding embodiments of the MCM may be included in a system and/or an electronic device. This is shown in FIG. 5, which presents a block diagram of an electronic device 500 that includes an MCM 510, such as one of the MCMs in the preceding embodiments.

Furthermore, embodiments of the MCM may be used in a variety of applications, including: VLSI circuits, communication systems (such as in wavelength division multiplexing), storage area networks, data centers, networks (such as local area networks), and/or computer systems (such as multiple-core processor computer systems). For example, the MCM may be included in a backplane that is coupled to multiple processor blades, or the MCM may couple different types of components (such as processors, memory, input/output devices, and/or peripheral devices). In some embodiments, the MCM performs the functions of: a switch, a hub, a bridge, and/or a router.

Note that electronic device 500 may include, but is not limited to: a server, a laptop computer, a communication device or system, a personal computer, a work station, a mainframe computer, a blade, an enterprise computer, a data center, a portable-computing device, a supercomputer, a network-attached-storage (NAS) system, a storage-area-network (SAN) system, and/or another electronic computing device. Moreover, note that a given computer system may be at one location or may be distributed over multiple, geographically dispersed locations.

MCMs in FIGS. 1A-3, multi-level interposer plate 112-1 (FIGS. 1 and 4) and/or electronic device 500 may include fewer components or additional components. For example, negative alignment features in FIG. 1A may be defined in layers that are deposited on second surfaces 116 (FIGS. 1A-4) or surfaces of each island chip, and these negative alignment features may be recessed below surfaces of the top layers deposited on substrates in these components. Similarly, positive alignment features may protrude above a local surface, which may be second surfaces 116 (FIGS. 1A-4), surfaces of each island chip or surfaces of top layers deposited on substrates in these components. Thus, in the preceding embodiments a surface of a substrate should be understood to include a surface of a layer deposited on the substrate or a surface of the substrate itself. In some embodiments, multi-level interposer plate 112-1 (FIGS. 1 and 4) is used to facilitate at-speed testing of an MCM (such as one of the MCMs in FIGS. 1A-3), either separately or in addition to packaging.

Figure 6:
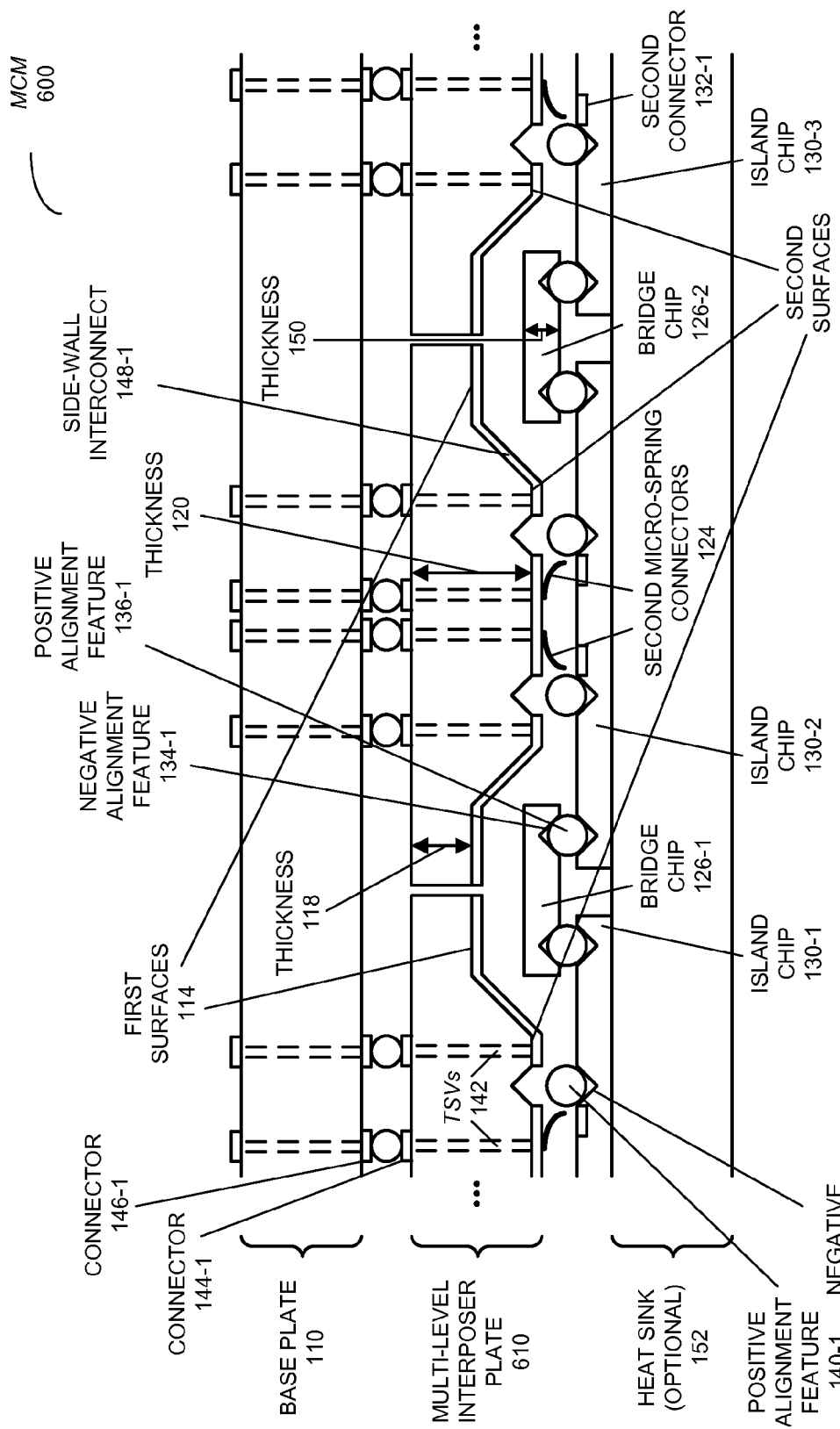
FIG. 6 is a block diagram of an electronic device that includes an MCM in accordance with an embodiment of the present disclosure.

Moreover, as shown in FIG. 6, multi-level interposer plate 610 may not include first micro-spring connectors 122. Instead, bridge chips 126 in MCM 600 may derive their power and ground from island chips 130 with conductive positive alignment features (such as positive alignment feature 136-1, which may be a micro-sphere or a ball) and metallized negative alignment features (such as negative alignment feature 134-1, which may be a pit). For example, the same ball-in-pit structures used for alignment on the surfaces of bridge chips 126 that face island chips 130 may be electrically conductive, and these surfaces of bridge chips 126 may include electrically conductive traces (not shown) so that bridge chips 126 can derive power and ground without TSVs or micro-spring connectors in the recessed regions of multi-level interposer plate 610.

More generally, in some embodiments multi-level interposer plate 112-1 (FIGS. 1 and 4) may include conductive pads instead of micro-spring connectors to establish electrical connection to bridge chips 126 and/or island chips 130.

Figure 7A:
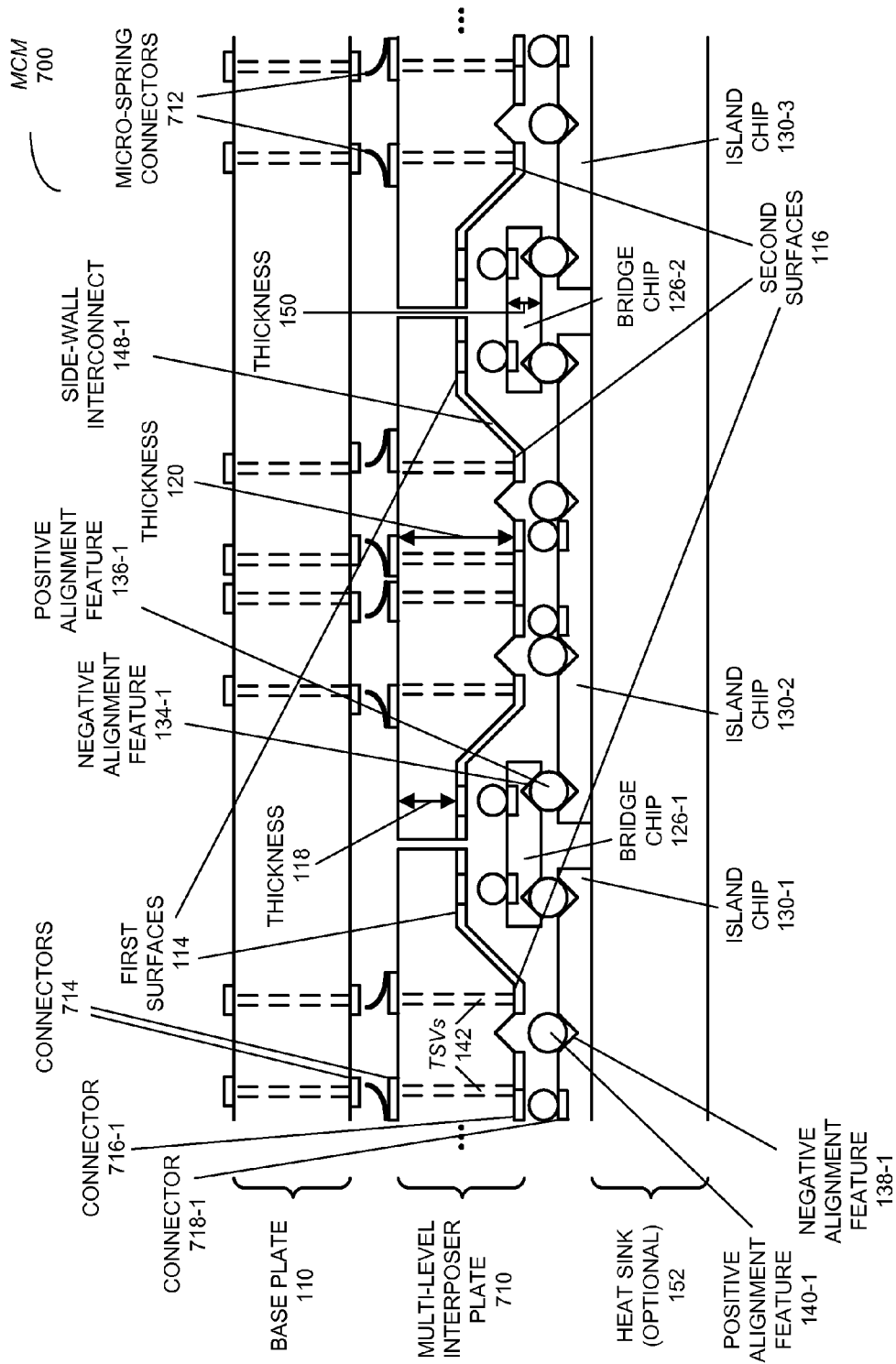
FIG. 7A is a block diagram of an electronic device that includes an MCM in accordance with an embodiment of the present disclosure.
Figure 7B:
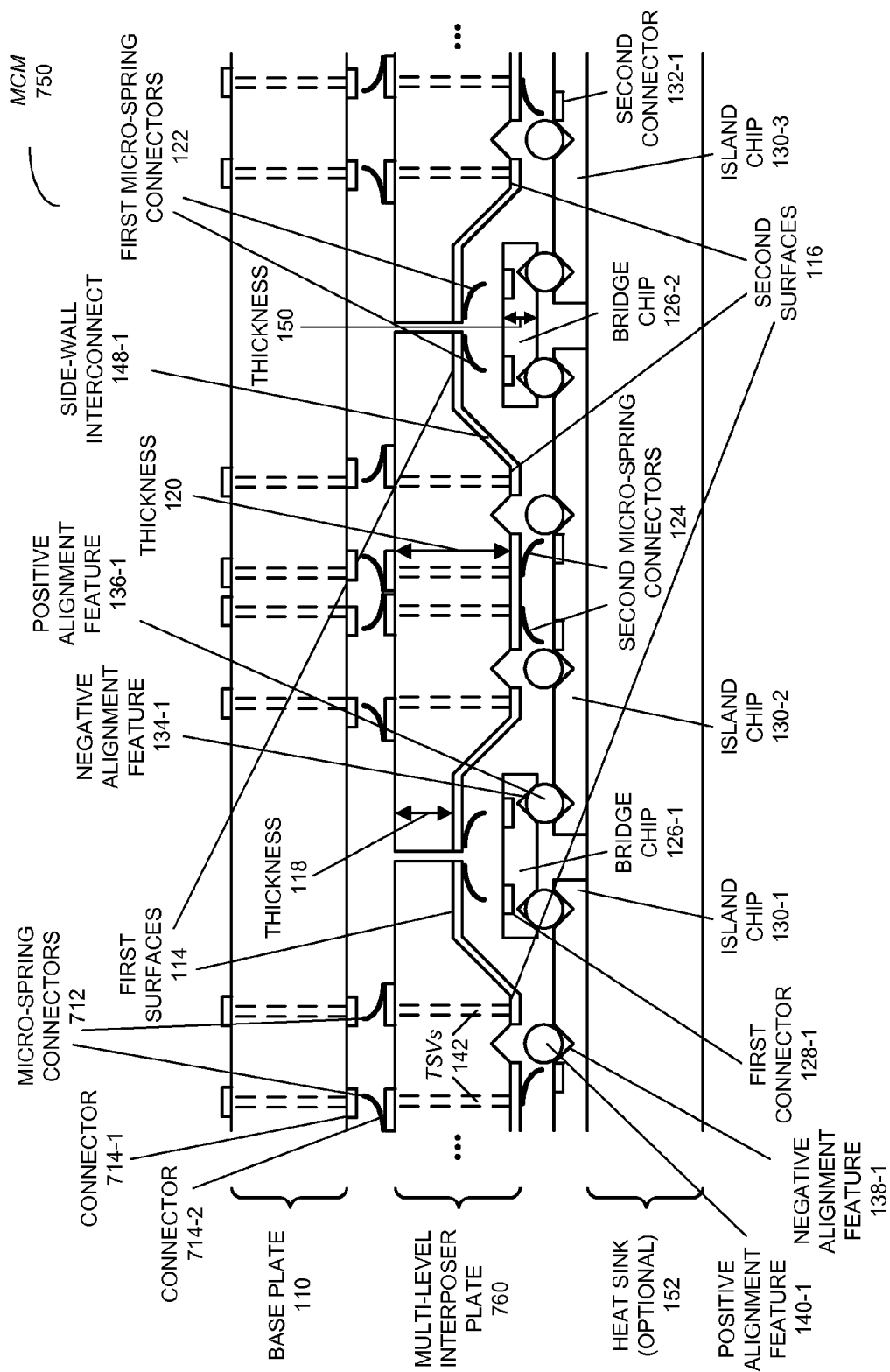
FIG. 7B is a block diagram of an electronic device that includes an MCM in accordance with an embodiment of the present disclosure.

In addition, as shown in FIG. 7A, multi-level interposer plate 710 in MCM 700 may included connectors (such as connectors 716-1 and 718-1) and bumps or solder to electrically couple to bridge chips 126 and to island chips 130, and micro-spring connectors 712 to electrically couple to base plate 110 using connectors 714. The compliance of micro-spring connectors 712 may accommodate a non ideal base plate 110 (such as a base plate with thickness variations, or a mismatch in the coefficient of thermal expansion with that of multi-level interposer plate 710). Alternatively, as shown in FIG. 7B, multi-level interposer plate 760 in MCM 750 may include first micro-spring connectors 122, second micro-spring connectors 124, and micro-spring connectors 712.

Furthermore, although these embodiments are illustrated as having a number of discrete items, these MCMs, multi-level interposer plates and electronic devices are intended to be functional descriptions of the various features that may be present rather than structural schematics of the embodiments described herein. Consequently, in these embodiments two or more components may be combined into a single component, and/or a position of one or more components may be changed.

Note that positive alignment features and/or negative alignment features may be defined using an additive process (i.e., a material-deposition process) and/or a subtractive process (i.e., a material-removal process). For example, the process may include: sputtering, plating, isotropic etching, anisotropic etching, a photolithographic technique and/or a direct-write technique. Additionally, these features may be fabricated using a wide variety of materials, including: a semiconductor, metal, glass, sapphire, and/or silicon dioxide.

While the preceding embodiments illustrate MCMs in which bridge chips 126 (FIGS. 1A-3) are positioned in negative recesses in the multi-level interposer plates (i.e., in regions having thickness 118 in FIGS. 1A-3), in other embodiments island chips 130 (FIGS. 1A-3) may be positioned in negative recesses in the multi-level interposer plates. Furthermore, while the micro-spring connectors can be used to provide remateable mechanical coupling, in other embodiments the micro-spring connectors provide rigid mechanical coupling.

We now describe embodiments of processes for fabricating a multi-layer interposer plate. In these embodiments, micro-spring connectors can be fabricated using 3-dimensional stress-engineered devices, which enable testing, packaging and re-work, as well as variable gap or spacing control between proximity-communication connectors. Note that the micro-spring connectors may have: low resistance, high current, high compliance and/or dense 2-dimensional arrays.

Figure 8A:
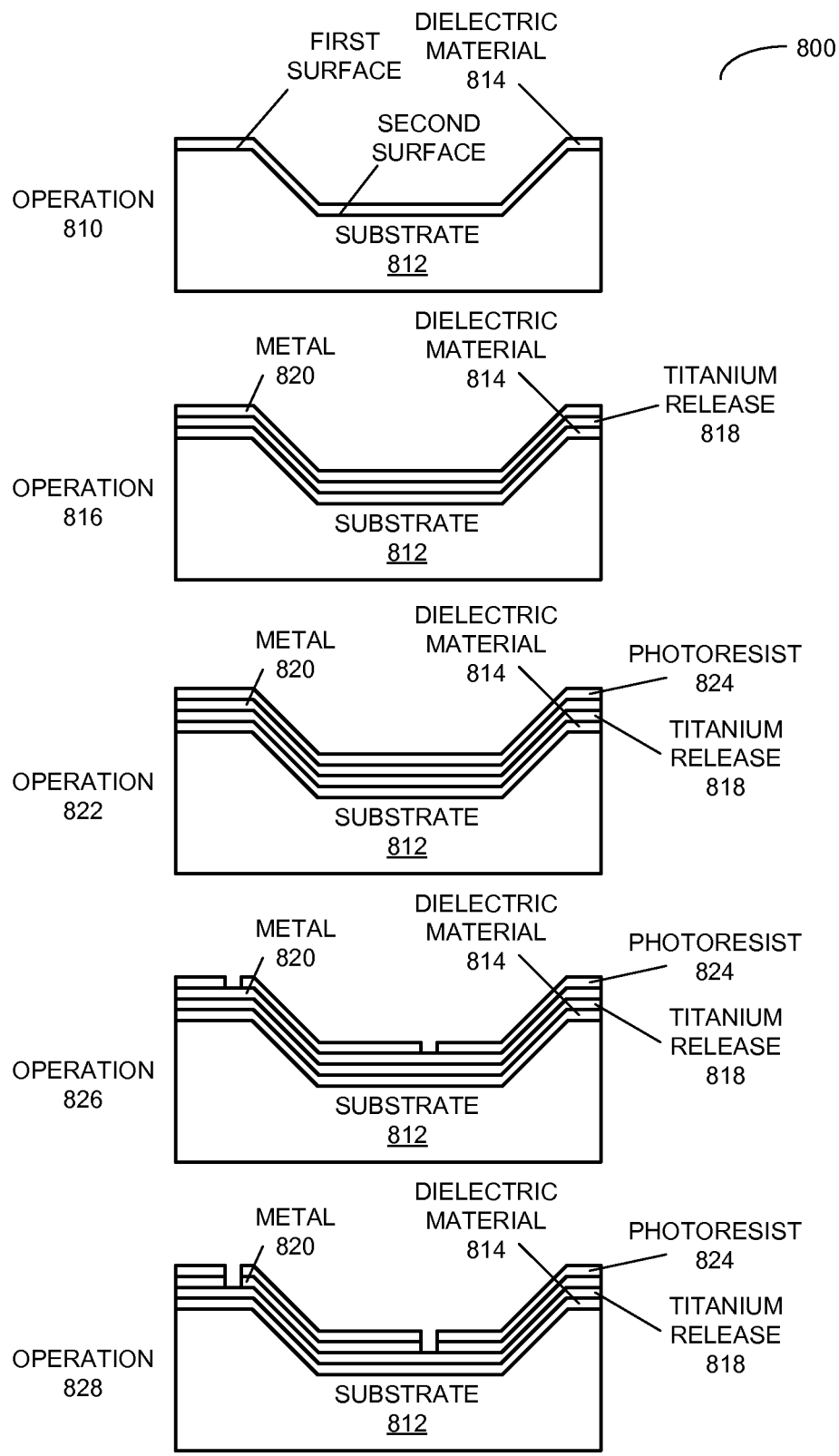
FIG. 8A is a flow diagram illustrating a process for fabricating a multi-level interposer plate in accordance with an embodiment of the present disclosure.
Figure 8B:
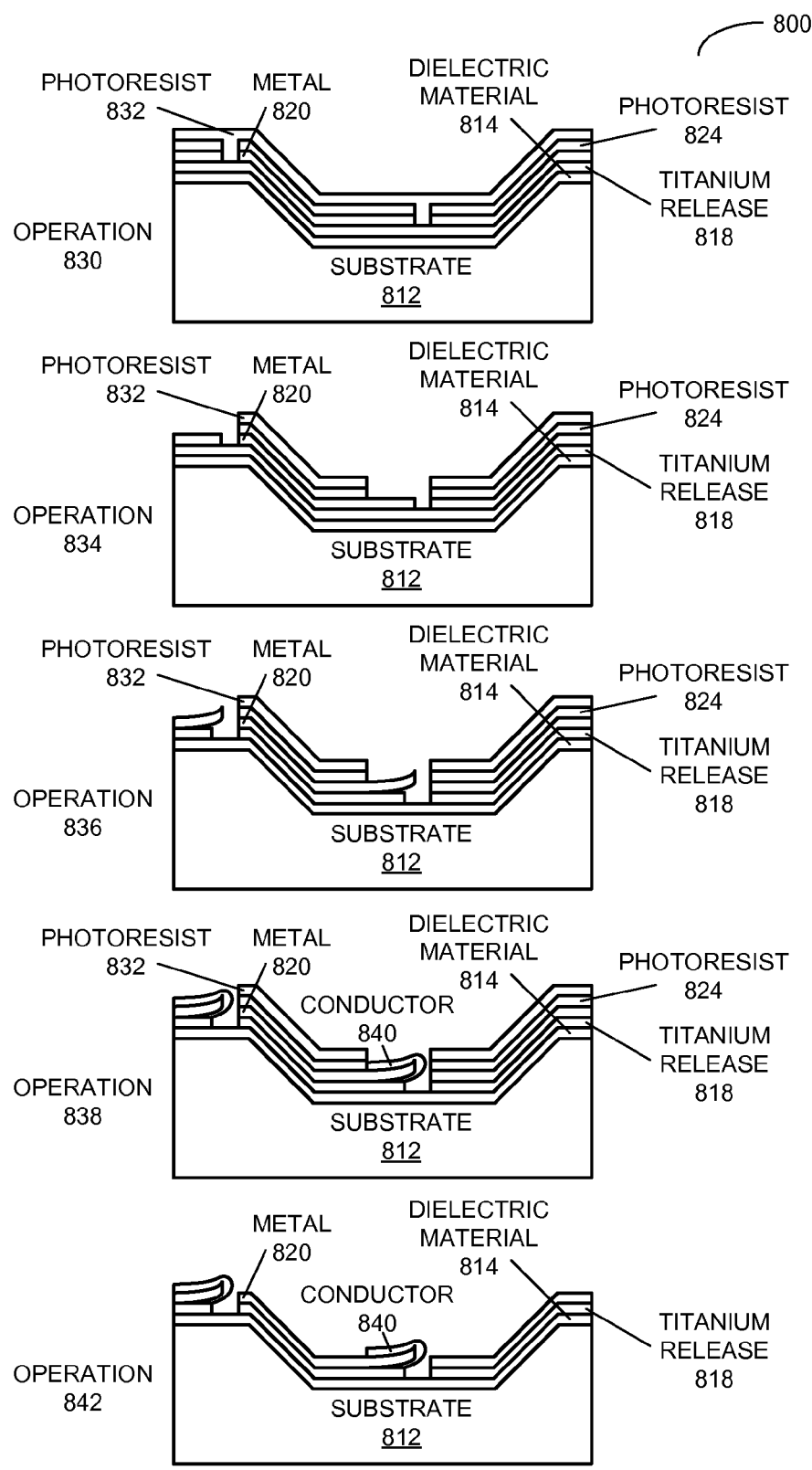
FIG. 8B is a flow diagram illustrating the process for fabricating the multi-level interposer plate of FIG. 8A in accordance with an embodiment of the present disclosure.

FIGS. 8A-8B presents a flow diagram illustrating a process 800 for fabricating a two-level multi-level interposer plate with sidewall interconnects. In operation 810, a dielectric material 814 (such as nitride) is deposited on one or both sides of a silicon substrate 812. Note that starting substrate 812 has 150-μm deep recessed regions or etch pits. Furthermore, note that the TSVs and the negative alignment features are not shown, but starting substrate 812 may include these features. In addition, wet silicon etches, such as with TMAH or KOH acids, can be used to etch the silicon and leave smooth sidewalls and bottoms in the recessed regions.

Then, the stress-engineered metal for the micro-spring connectors may be deposited and patterned into the micro-spring connectors. In particular, in operation 816, a titanium release 818 and stress-engineered micro-spring-connector core metal 820 is deposited. Moreover, in operation 822, a photoresist 824, such as an electroplate resist, is coated. Note that electroplated photoresist can be used to ensure uniform thickness (conformal) resist coverage in the recessed regions and the sidewalls.

Furthermore, this photoresist is developed in operation 826 (for example, using UV exposure) to expose level 1 (mask: metal 1-1) and to expose level 2 (mask: metal 1-2), which are then developed together. If needed, dual-operation lithography can be used to address problems with depth of focus, which can reduce the imaging quality. Furthermore, the sidewall interconnects can also be patterned along with the micro-spring connectors. Additionally, in some embodiments the micro-spring connectors inside the recessed regions (first surfaces 114 in FIGS. 1A-4) are fewer in number and larger than the micro-spring connectors on second surfaces 116 (FIGS. 1A-4). This may make the lithography easier. Note that other lithography techniques, such as direct laser exposure, may be used to address the severe resist topography.

Next, the micro-spring connectors are released, which allows the built-in stress gradient to lift the micro-spring-connector tip out of the plane. In particular, in operation 828, the micro-spring-connector metal 820 is etched, and photoresist 824 is stripped. Subsequently, in operation 830, a photoresist 832 such as an electroplate resist, is coated. This photoresist is developed in operation 834 to expose level 1 (mask: release 1-1) and to expose level 2 (mask: release 1-2), which are then developed together. Furthermore, in operation 836 the micro-spring connectors are released. For example, in order to release the micro-spring connectors, the sacrificial titanium release 818 may be etched so that the micro-spring connectors detach from substrate 812 and the inherent stress in the micro-spring connectors is allowed to relax by lifting the micro-spring connectors out of the plane, while the anchor region remains attached.

In operation 838 the micro-spring connectors are plated with a conductor 840 (such as a metal), and adhesion/plating electrode layer titanium release 818 is etched to electrically isolate the micro-spring connectors. Note that the sidewall interconnect lines may be electroplated (not shown) along with or separately from the micro-spring connectors if lower resistance is needed. Then, in operation 842, photoresist 824 and 832 are stripped and titanium release 818 is cleared.

Note that the process operations for fabricating the sidewall interconnects may be low risk because they may be performed prior to those for the TSVs. For example, the sidewall interconnects may be fabricated using: electroplated photoresist, standard metal deposition and/or standard glass-mask-based photolithography. In FIGS. 8A and 8B, the recessed regions are not through-holes, and the stress-engineered micro-spring fabrication is integrated.

In some embodiments, instead of building pits/sidewall interconnects on silicon substrates, the fabrication process may be performed on a ceramic substrate. This may obviate the need for silicon substrates and/or the need to assemble multiple single-chip scale silicon interposers (which are sometimes referred to as 'sub-components' in a hybrid multi-level interposer plate). In contrast with silicon substrates, low-cost TSVs are readily available in ceramic substrates. However, in these embodiments the micro-spring connectors may be fabricated for a final unit size having the dimension of the entire MCM (e.g., many inches in diameter), which may increase the requirements on the micro-spring-connector yield. When semiconductor substrates are used, smaller units (such as chip scale) can be fabricated, which may have a smaller area that makes it easier to achieve 100% yield.

FIG. 9 presents a flow chart illustrating a process 900 for fabricating a multi-level interposer plate for use in an MCM, such as one of the MCMs in the preceding embodiments. During the process, the first micro-spring connectors are defined on first surfaces of first substrates (operation 910), where the first substrates have a first thickness. Then, second micro-spring connectors are defined on second surfaces of second substrates (operation 912), where the second substrates have a second thickness. Note that the second thickness may be greater than the first thickness. Next, the first substrates and the second substrates are attached to a mechanical alignment plate (operation 914). Furthermore, the first substrates are mechanically coupled to the second substrates (operation 916), thereby fabricating the multi-level interposer plate. Subsequently, the mechanical alignment plate may be optionally detached (operation 918).

In some embodiments of processes 800 (FIGS. 8A and 8B) and 900, there are additional or fewer operations. Moreover, the order of the operations may be changed, and/or two or more operations may be combined into a single operation.

While embodiments of the multi-layer interposer plate have been illustrated in embodiments of the MCM, in other embodiments the multi-layer interposer plate may be used in a variety of different applications to provide electrical and mechanical coupling to arbitrary components.

The foregoing description is intended to enable any person skilled in the art to make and use the disclosure, and is provided in the context of a particular application and its requirements. Moreover, the foregoing descriptions of embodiments of the present disclosure have been presented for purposes of illustration and description only. They are not intended to be exhaustive or to limit the present disclosure to the forms disclosed. Accordingly, many modifications and variations will be apparent to practitioners skilled in the art, and the general principles defined herein may be applied to other embodiments and applications without departing from the spirit and scope of the present disclosure. Additionally, the discussion of the preceding embodiments is not intended to limit the present disclosure. Thus, the present disclosure is not intended to be limited to the embodiments shown, but is to be accorded the widest scope consistent with the principles and features disclosed herein.

What is claimed is:

1. A method for fabricating a multi-level interposer plate for use in an multi-chip module, comprising:
    defining first micro-spring connectors on first surfaces of first substrates, wherein the first substrates have a first thickness;
    defining second micro-spring connectors on second surfaces of second substrates, wherein the second substrates have a second thickness, wherein the second thickness is greater than the first thickness;
    attaching the first substrates and the second substrates to a mechanical alignment plate; and
    mechanically coupling the first substrates and the second substrates to a base plate, thereby fabricating the multi-level interposer plate.

2. The method of claim 1, wherein the method further includes detaching the mechanical alignment plate.

3. The method of claim 1, wherein a micro-spring connector on a substrate is fabricated by:
    depositing a metal layer on the substrate; and
    forming a portion of the metal layer into the micro-spring connector.

4. The method of claim 3, wherein depositing the metal layer on the substrate comprises:
    depositing a stress-engineered metal layer on the substrate; and
    depositing a titanium release layer on the stress-engineered metal layer.

5. The method of claim 4, wherein forming the portion of the metal layer into the micro-spring connector comprises:
    depositing a photoresist on the metal layer;
    developing a region of the photoresist proximate to the portion of the metal layer;
    performing at least one etching operation to expose the portion of the metal layer; and
    removing the titanium release layer in the portion of the metal layer to release the stress-engineered metal layer in the portion of the metal layer, the released stress-engineered metal layer in the portion of the metal layer forming the micro-spring connector.

6. The method of claim 5, wherein the method further comprises:
    depositing a conductive material on the released portion of the stress-engineered metal layer.

7. The method of claim 3, wherein the method further comprises:
    fabricating one or more recessed regions in the substrate;
    wherein depositing the stress-engineered metal layer on the substrate comprises depositing the stress engineered metal layer in the recessed region in the substrate; and
    wherein forming the portion of the metal layer into the micro-spring connector comprises forming a portion of the metal layer in the recessed region into the micro-spring connector.

8. The method of claim 3, wherein the method further comprises:
    depositing a dielectric layer on the substrate; and
    depositing the metal layer on the dielectric layer.

9. The method of claim 3, wherein the method further comprises:
    fabricating one or more thru-substrate vias in the substrate.

* * * * *